US011302756B2

(12) United States Patent
Xiang et al.

(10) Patent No.: US 11,302,756 B2
(45) Date of Patent: Apr. 12, 2022

(54) DISPLAY UNIT, DISPLAY UNIT MANUFACTURING METHOD AND ORGANIC LIGHT EMITTING DIODE DISPLAY DEVICE WITH DESICCANTS

(71) Applicant: WUHAN CHINA STAR OPTOELECTRONICS SEMICONDUCTOR DISPLAY TECHNOLOGY CO., LTD., Hubei (CN)

(72) Inventors: Ming Xiang, Hubei (CN); Shoucheng Wang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 616 days.

(21) Appl. No.: 16/326,062

(22) PCT Filed: Dec. 29, 2018

(86) PCT No.: PCT/CN2018/125302
§ 371 (c)(1),
(2) Date: Feb. 15, 2019

(87) PCT Pub. No.: WO2020/113732
PCT Pub. Date: Jun. 11, 2020

(65) Prior Publication Data
US 2021/0359040 A1 Nov. 18, 2021

(30) Foreign Application Priority Data
Dec. 7, 2018 (CN) .......................... 201811497360.1

(51) Int. Cl.
*H01L 27/32* (2006.01)
*H01L 51/00* (2006.01)
(Continued)

(52) U.S. Cl.
CPC ...... *H01L 27/3246* (2013.01); *H01L 27/3262* (2013.01); *H01L 51/0034* (2013.01);
(Continued)

(58) Field of Classification Search
CPC ............. H01L 27/3246; H01L 27/3262; H01L 51/0034; H01L 51/5209; H01L 51/5259; H01L 51/56
See application file for complete search history.

(56) References Cited

U.S. PATENT DOCUMENTS 9,799,712 B2 10/2017 Kishimoto et al.
2008/0315755 A1* 12/2008 Han ...................... H01L 51/525
313/504
(Continued)

FOREIGN PATENT DOCUMENTS

CN 103972267 A 8/2014
CN 105390620 A 3/2016
(Continued)

*Primary Examiner* — Quoc D Hoang
(74) *Attorney, Agent, or Firm* — Hauptman Ham, LLP

(57) ABSTRACT

A display unit, a display unit manufacturing method, and an organic light emitting diode display device are provided. The display unit includes: a substrate; a thin film transistor layer disposed above the substrate; an anode metal layer disposed above the thin film transistor layer; a pixel definition layer disposed above the anode metal layer; a light emitting structure disposed above the pixel definition layer. The pixel definition layer includes a first lamination layer and a second lamination layer disposed above the first lamination layer. Desiccants are distributed evenly in the second lamination layer.

16 Claims, 5 Drawing Sheets

(51) Int. Cl.
    *H01L 51/52*    (2006.01)
    *H01L 51/56*    (2006.01)
(52) U.S. Cl.
    CPC ...... *H01L 51/5209* (2013.01); *H01L 51/5259* (2013.01); *H01L 51/56* (2013.01)

(56) References Cited

U.S. PATENT DOCUMENTS

| | | | |
|---|---|---|---|
| 2014/0319475 A1* | 10/2014 | Joo | H01L 27/3246 257/40 |
| 2016/0133678 A1 | 5/2016 | Beak et al. | |
| 2016/0260785 A1 | 9/2016 | Jiao | |
| 2018/0175318 A1 | 6/2018 | Xu et al. | |
| 2019/0043936 A1* | 2/2019 | Hur | H01L 51/0094 |
| 2019/0280246 A1 | 9/2019 | Cheng | |

FOREIGN PATENT DOCUMENTS

| | | |
|---|---|---|
| CN | 105590949 A | 5/2016 |
| CN | 105826357 A | 8/2016 |
| CN | 207116481 U | 3/2018 |
| CN | 108511631 A | 9/2018 |

* cited by examiner

DISPLAY UNIT, DISPLAY UNIT MANUFACTURING METHOD AND ORGANIC LIGHT EMITTING DIODE DISPLAY DEVICE WITH DESICCANTS

FIELD OF INVENTION

The present invention relates to a field of electronic displays, especially relates to a display unit, a display unit manufacturing method, and an organic light emitting diode display device.

BACKGROUND OF INVENTION

An organic light emitting diode (OLED) display device is considered as an emerging technology for the next generation of flat display devices because of its simple structure, fast response times, and flexible panel applications.

An organic light emitting unit is very sensitive to moisture. A small amount of moisture can seriously affect luminescence quality of the OLED. Therefore, it is necessary to ensure that the organic light emitting unit remains dry inside. In order to avoid the influence of moisture on illumination of the OLED, the prior art utilizes a package substrate 250 to block the invasion of external moisture, as shown in FIG. 1. For the moisture generated in the production and operation of a display substrate, water can be absorbed by adding desiccants to each layer in the display substrate. With reference to FIG. 1, a pixel definition layer 210 of the OLED display unit has desiccants 260, which absorb the moisture inside the display unit and enhance stability of the OLED unit.

SUMMARY OF INVENTION

Technical Issue

The desiccants in the pixel definition layer 210 expand due to water absorption, to cause the pixel definition layer to be separated from other layers. A gap is formed on the side of the display unit, and external water and oxygen can invade the organic light emitting unit from the gap showing the side of the substrate to damage the structure of the organic light emitting diode (OLED) display unit.

Technical Solution

The present invention provides a display unit, display unit manufacturing method and an organic light emitting diode display device to solve the technical issue that desiccants in the pixel definition layer expand due to water absorption, to cause the pixel definition layer to be separated from other layers, a gap is formed on the side of the display unit, and external water and oxygen can invade the organic light emitting unit from the gap showing the side of the substrate to damage the sealing structure of the display device.

To solve the above issue, the present invention provides a display unit, the display unit comprising:

a substrate;

a thin film transistor layer disposed above the substrate;

an anode metal layer disposed above the thin film transistor layer, and connected to a source and drain wiring layer of the thin film transistor layer;

a pixel definition layer disposed above the anode metal layer, wherein the pixel definition layer comprises a communication hole defined through the pixel definition layer; and a light emitting structure disposed above the pixel definition layer;

wherein the pixel definition layer comprises a first lamination layer disposed above the anode metal layer and a second lamination layer disposed above the first lamination layer, and desiccants are distributed evenly in the second lamination layer.

According to one aspect of the present invention, the first lamination layer consists of a polymer material including a first functional group, and the first functional group comprises one or more of an alkenyl group, a carboxyl group, and an amine group.

According to one aspect of the present invention, the second lamination layer consists of a polymer material including a second functional group, and the second functional group comprises one or more of an alkenyl group, a carboxyl group, and an amine group; wherein when a temperature is increased, the second functional group and the first functional group on an abutment place between the first lamination layer and the second lamination layer are reacted chemically to form a third lamination layer, and the third lamination layer is a dense mesh structure.

According to one aspect of the present invention, the polymer material of the first lamination layer and the polymer material of the second lamination layer are the same, and a ratio of a height of the first lamination layer and a height of the second lamination layer is from 1:1 to 1:2.

According to one aspect of the present invention, the pixel definition layer further comprises a fourth lamination layer disposed above the second lamination layer, and the fourth lamination layer comprises a structure and material that are the same as those of the first lamination layer.

According to one aspect of the present invention, the desiccants are physical desiccants and/or chemical desiccants, and comprise a combination of one or more of tantalum, calcium oxide, calcium carbonate; wherein the desiccants are particle solids with same shapes and the particle solids are distributed evenly in the second lamination layer.

Accordingly, the present invention also provides a display unit manufacturing method, comprising steps as follows:

providing a substrate;

forming a thin film transistor layer above the substrate;

forming an anode metal layer located above the thin film transistor layer and connected to a source and drain wiring layer in the thin film transistor layer;

forming a pixel definition layer located above the anode metal layer, and defining a communication hole extending through the pixel definition layer; and forming a light emitting structure located above the pixel definition layer;

wherein the pixel definition layer comprises a first lamination layer located above the anode metal layer and a second lamination layer located above the first lamination layer, and the second lamination layer comprises desiccants distributed evenly in the second lamination layer.

According to one aspect of the present invention, the first lamination layer consists of a polymer material including a first functional group, and the first functional group comprises one or more of an alkenyl group, a carboxyl group, and an amine group; the second lamination layer consists of a polymer material including a second functional group, and the second functional group comprises one or more of an alkenyl group, a carboxyl group, and an amine group; wherein when a temperature is increased, the second functional group and the first functional group on an abutment place between the first lamination layer and the second lamination layer are reacted chemically to form a third lamination layer, and the third lamination layer is a dense mesh structure.

According to one aspect of the present invention, the polymer material of the first lamination layer and the polymer material of the second lamination layer are the same, and a ratio of a height of the first lamination layer and a height of the second lamination layer is from 1:1 to 1:2.

According to one aspect of the present invention, the pixel definition layer further comprises a fourth lamination layer disposed above the second lamination layer, and the fourth lamination layer comprises a structure and material that are the same as those of the first lamination layer.

Accordingly, the present invention also provides an organic light emitting diode display device, the organic light emitting diode display device comprises display unit, the display unit comprises:

a substrate;

a thin film transistor layer disposed above the substrate;

an anode metal layer disposed above the thin film transistor layer, and connected to a source and drain wiring layer of the thin film transistor layer;

a pixel definition layer disposed above the anode metal layer, wherein the pixel definition layer comprises a communication hole defined through the pixel definition layer; and a light emitting structure disposed above the pixel definition layer;

wherein the pixel definition layer comprises a first lamination layer disposed above the anode metal layer and a second lamination layer disposed above the first lamination layer, and desiccants are distributed evenly in the second lamination layer.

According to one aspect of the present invention, the first lamination layer consists of a polymer material including a first functional group, and the first functional group comprises one or more of an alkenyl group, a carboxyl group, and an amine group.

According to one aspect of the present invention, the second lamination layer consists of a polymer material including a second functional group, and the second functional group comprises one or more of an alkenyl group, a carboxyl group, and an amine group; wherein when a temperature is increased, the second functional group and the first functional group on an abutment place between the first lamination layer and the second lamination layer are reacted chemically to form a third lamination layer, and the third lamination layer is a dense mesh structure.

According to one aspect of the present invention, the polymer material of the first lamination layer and the polymer material of the second lamination layer are the same, and a ratio of a height of the first lamination layer and a height of the second lamination layer is from 1:1 to 1:2.

According to one aspect of the present invention, the pixel definition layer further comprises a fourth lamination layer disposed above the second lamination layer, and the fourth lamination layer comprises a structure and material that are the same as those of the first lamination layer.

According to one aspect of the present invention, the desiccants are physical desiccants and/or chemical desiccants, and comprise a combination of one or more of tantalum, calcium oxide, calcium carbonate; wherein the desiccants are particle solids with same shapes and the particle solids are distributed evenly in the second lamination layer.

Advantages

The present invention provides a display unit of an organic light emitting diode display device and a display unit manufacturing method that, by manufacturing a pixel definition layer into a lamination layer structure with two or more layers of and adding desiccants into an uppermost layer of the lamination layer structure, prevent water in the substrate from invading the organic light emitting unit. In another aspect, a high molecular polymer with a functional group on the main catenation is used as material constructing the lamination layer structure with the two or more layers (the functional group can be alkenyl, carboxyl or amino). As the functional group on the main catenation of the high molecular polymer further reacts, the two or more layers of the lamination layer structure have tightly connected boundaries therebetween to suppress separation of film layers due to water absorption of the desiccants.

DETAILED DESCRIPTION OF PREFERRED EMBODIMENTS

Figure 1:
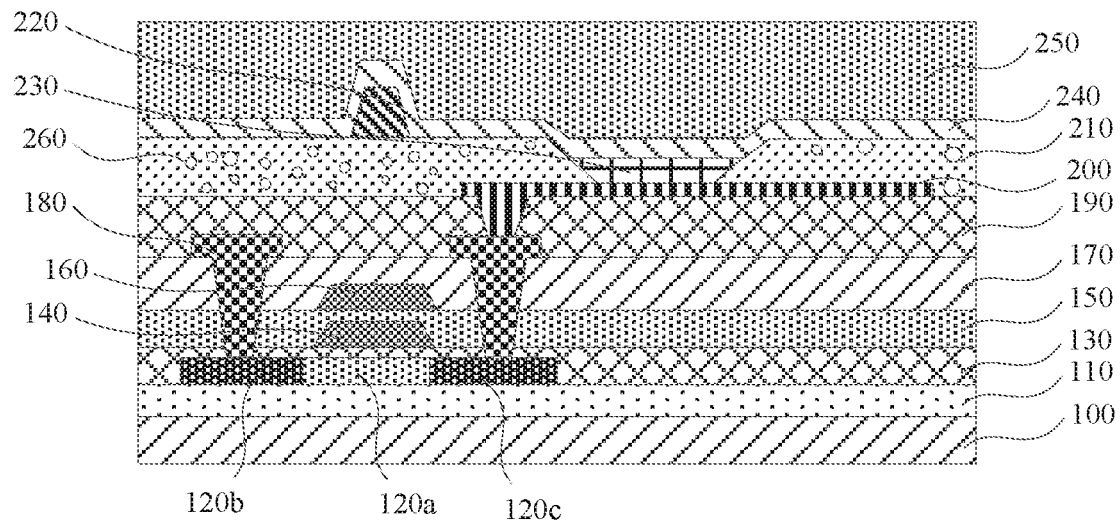
FIG. 1 is a schematic structural view of an anode of a conventional display unit.

Each of the following embodiments is described with appending figures to illustrate specific embodiments of the present invention that are applicable. The terminologies of direction mentioned in the present invention, such as "upper", "lower", "front", "rear", "left", "right", "inner", "outer", "side surface", etc., only refer to the directions of the appended figures. Therefore, the terminologies of direction are used for explanation and comprehension of the present invention, instead of limiting the present invention. In the figures, units with similar structures are marked with the same reference characters.

With reference to FIG. 1 for a brief explanation of the prior art. FIG. 1 is a schematic structural view of an anode of a conventional display unit. The display unit comprises: a substrate 100; a buffer layer 110 located above the substrate 100; a polycrystalline layer 120 located above the buffer layer 110, wherein the polycrystalline layer 120 comprises a channel region 120a and heavy doping regions 120b and 120c; a first gate insulation layer 130 located above the polycrystalline layer 120; a first metal gate electrode layer 140 located above the first gate insulation layer 130; a second gate insulation layer 150 covering the first metal gate electrode 140 and the first gate insulation layer 130; a second metal gate electrode layer 160 located above the second gate insulation layer 150; an interlayer dielectric layer 170 covering the second metal gate electrode 160 and the second gate insulation layer 150; a source and drain wiring layer 180 extending through the interlayer dielectric layer 170 and the second gate insulation layer 150, and connected to heavy doping regions 120b and 120c; an organic planarization layer 190 covering the source and drain wiring layer 180 and the interlayer dielectric layer 170; an anode metal layer 200 extending through the organic planarization layer 190 and connected to the source and drain wiring layer; a pixel definition layer 210 located above the anode metal layer 200, wherein the pixel definition layer comprises a communication hole located above the anode metal layer 200 and defined through the pixel definition layer 210; and a light emitting structure and an encapsulation substrate 250 located above the pixel definition layer.

Because the organic light emitting unit is very sensitive to water, a very small amount of water would affect the quality of the light emitting structure. As shown in FIG. 1, in order to prevent affecting the organic light emitting diode, the prior art utilizes the encapsulation substrate 250 to block external water from invasion. Regarding water generated during the manufacture and operation of the display unit, it can be removed by adding desiccants 260 into the pixel definition layer 210 of the display unit. However, when the desiccants are added into the pixel definition layer 210, with absorption of the desiccants to water, the pixel definition layer accordingly expands, which results in separation of the pixel definition layer 210 from other film layers. Therefore, invasion of ambient water and oxygen to the organic light emitting unit from a side of the display substrate is intensified.

With regard to the above issue, the present invention provides a display unit, a display unit manufacturing method, and an organic light emitting diode display device to solve the technical issue of the conventional organic light emitting diode display device that the desiccants in the pixel definition layer 210 expand due to water absorption, forming a gap on the side of the display device to damage the sealing structure of the display device. The present invention will be described in details with accompanying drawings as follows.

Figure 7:
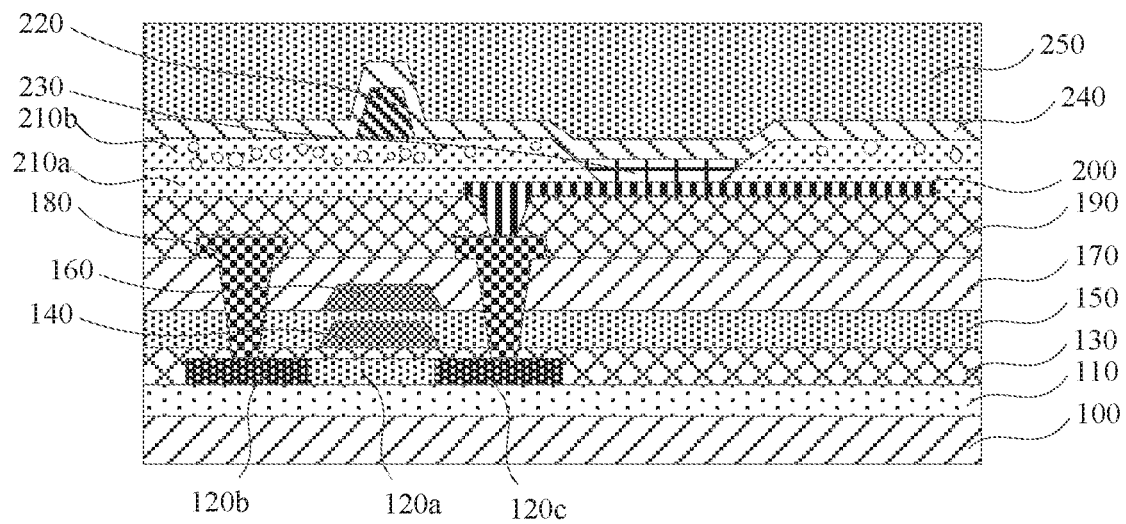

With reference to FIG. 7, the present invention provides a display unit, the display unit comprises: a substrate; a thin film transistor layer disposed above the substrate; an anode metal layer disposed above the thin film transistor layer and connected to a source and drain wiring layer of the thin film transistor layer; a pixel definition layer disposed above the anode metal layer, wherein the pixel definition layer comprises a communication hole defined through the pixel definition layer; and a light emitting structure disposed above the pixel definition layer; wherein the pixel definition layer comprises a first lamination layer disposed above the anode metal layer and a second lamination layer disposed above the first lamination layer, and desiccants are distributed evenly in the second lamination layer. The desiccants are physical desiccants and/or chemical desiccants, and comprise a combination of one or more of tantalum, calcium oxide, calcium carbonate; wherein the desiccants are particle solids with the same shapes and the particle solids are distributed evenly in the second lamination layer 210b.

In the present embodiment, the display unit further comprises a buffer layer 110 located above substrate 100. Specifically, the thin film transistor layer comprises: a polycrystalline layer 120 located above the buffer layer 110, wherein the polycrystalline layer 120 comprises a channel region 120a and heavy doping regions 120b and 120c; a first gate insulation layer 130 located above the polycrystalline layer 120; a first metal gate electrode layer 140 located above the first gate insulation layer 130; a second gate insulation layer 150 covering the first metal gate electrode 140 and the first gate insulation layer 130; a second metal gate electrode layer 160 located above the gate insulation layer 150; an interlayer dielectric layer 170 covering the second metal gate electrode 160 and the second gate insulation layer 150; a source and drain wiring layer 180 extending through the interlayer dielectric layer 170 and the second gate insulation layer 150 and connected to heavy doping regions 120b and 120c; and an organic planarization layer 190 covering the source and drain wiring layer 180 and the interlayer dielectric layer 170. The anode metal layer 200 extends through the organic planarization layer 190, and is connected to the source and drain wiring layer. The light emitting unit further comprises a light emitting structure and an encapsulation substrate 250 located above the pixel definition layer.

Specifically, in the present embodiment, the pixel definition layer comprises a first lamination layer 210a located above the anode metal layer and a second lamination layer 210b located above the first lamination layer 210a. Desiccants 260 are distributed evenly in the second lamination layer 210b. The first lamination layer 210a consists of a polymer material including a first functional group, and the first functional group comprises one or more of alkenyl, carboxyl and amino. The second lamination layer 210b consists of a polymer material including a second functional group, and the second functional group comprises one or more of alkenyl, carboxyl and amino. When the temperature is increased, the second functional group on an abutment position of the first lamination layer 210a and the second lamination layer 210b can chemically react with the first functional group to form a third lamination layer. The third lamination layer can be a dense mesh structure. The dense mesh structure can have a tightly connected boundary between the first lamination layer 210a and the second lamination layer 210b over the first lamination layer 210a to suppress separation of film layers due to water absorption of the desiccants.

Preferably, to simplify the processes, in the present embodiment the polymer material constructing the first lamination layer 210a is the same as the polymer material constructing the second lamination layer 210b, and a ratio of a height of the first lamination layer 210a and a height of the second lamination layer 210b is from 1:1 to 1:2.

Figure 9:
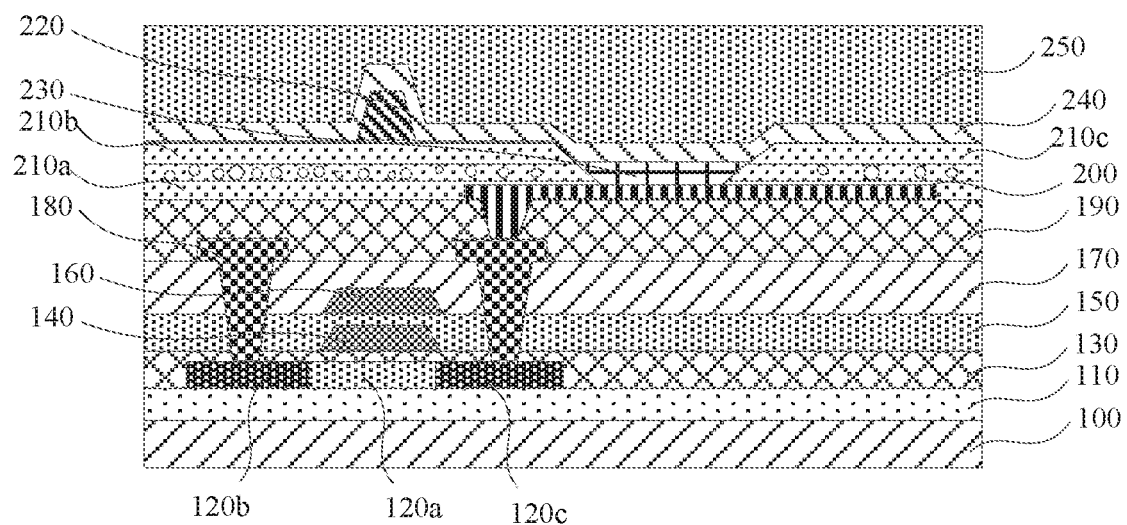

In another embodiment of the present invention, in order to better suppress separation of film layers due to water absorption of the desiccants, as shown in FIG. 9, the pixel definition layer further comprises a fourth lamination layer 210c disposed above second lamination layer 210b, and the fourth lamination layer 210c comprises a structure and material that are the same as those of the first lamination layer 210a. The fourth lamination layer 210c can form a dense mesh structure being the same as the third lamination layer between the lamination layer 210b and fourth lamination layer 210c to further suppress film separation phenomenon possibly generated between the pixel definition layer and its upper layer including metal electrodes and a light emitting structure.

Accordingly, the present invention also provides a display unit manufacturing method, comprising steps as follows:

providing a substrate;

forming a thin film transistor layer above the substrate;

forming an anode metal layer located above the thin film transistor layer and connected to a source and drain wiring layer in the thin film transistor layer;

forming a pixel definition layer located above the anode metal layer, and defining a communication hole extending through the pixel definition layer; and forming a light emitting structure located above the pixel definition layer;

wherein the pixel definition layer comprises a first lamination layer located above the anode metal layer and a second lamination layer located above the first lamination layer, and the second lamination layer comprises desiccants distributed evenly in the second lamination layer.

The above method will be described in detail in conjunction with FIGS. 2 to 7.

Figure 2:
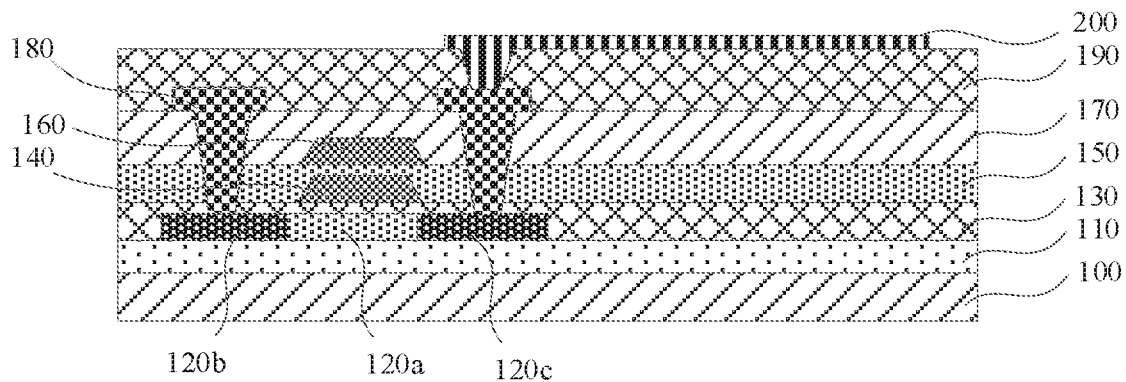
FIGS. 2 to 7 are schematic structural views of an anode of a display unit of a detailed embodiment of the present invention.

First, with reference to FIG. 2, a substrate 100 is provided; a buffer layer 110 is formed on the substrate 100; a polycrystalline layer 120 is deposited and on the buffer layer 110 and is etched to patternize the polycrystalline layer 120, and the polycrystalline layer 120 comprises a channel region 120a and heavy doping regions 120b and 120c; a first gate insulation layer 130 is formed above the polycrystalline layer 120; a first metal gate electrode layer 140 is formed above the first gate insulation layer 130 and is etched to patternize the first metal gate electrode layer 140; a second gate insulation layer 150 is formed on and covers the first metal gate electrode 140 and the first gate insulation layer 130; a second metal gate electrode layer 160 is formed above the gate insulation layer 150; an interlayer dielectric layer 170 is formed on and covers the second metal gate electrode 160 and the second gate insulation layer 150; a source and drain wiring layer 180 is formed through the interlayer dielectric layer 170 and the second gate insulation layer 150 and is connected to the heavy doping regions 120b and 120c; an organic planarization layer 190 is formed on and covers the source and drain wiring layer 180 and the interlayer dielectric layer 170; an anode metal layer 200 is formed through the organic planarization layer 190 and is connected to the source and drain wiring layer.

Figure 3:
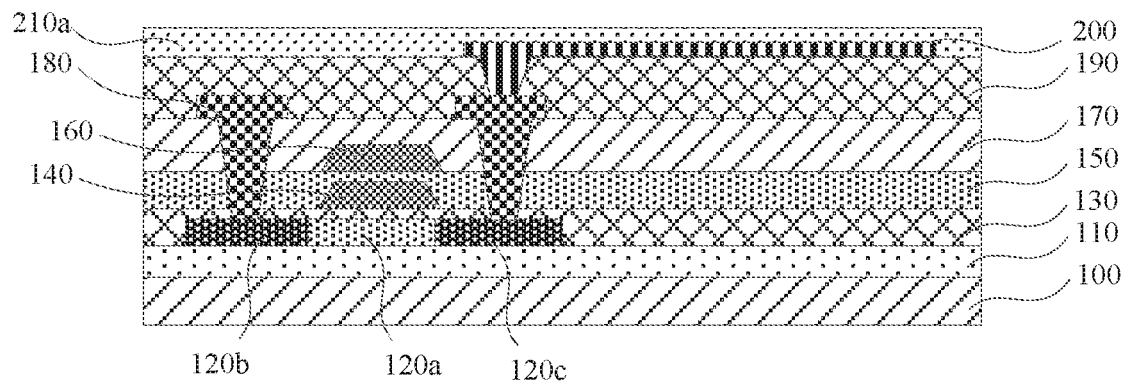

Next, with reference to FIG. 3, a first lamination layer 210a is coated above the anode metal layer 200. Specifically, the first lamination layer 210a consists of a polymer material including a first functional group, and the first functional group comprises one or more of alkenyl, carboxyl, and amino.

Figure 4:
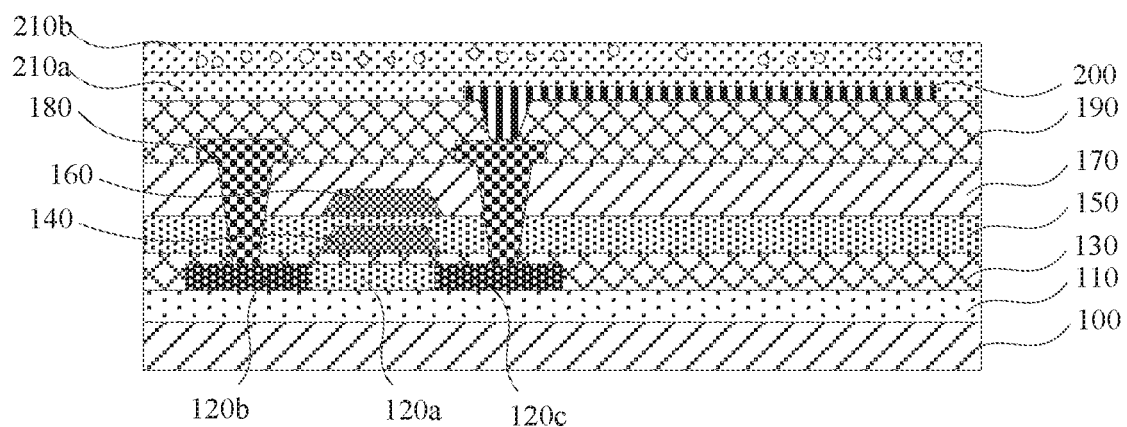

Then, with reference to FIG. 4, a second lamination layer 210b is formed above the first lamination layer 210a and includes desiccants 260. The second lamination layer 210b consists of a polymer material including a second functional group, and the second functional group comprises one or more of alkenyl, carboxyl and amino. When the temperature is increased, the second functional group on an abutment position of the first lamination layer 210a and the second lamination layer 210b can chemically react with the first functional group to form a third lamination layer. The third lamination layer can be a dense mesh structure.

Preferably, in order to simplify processes and save the cost, the polymer material constructing the first lamination layer 210a is the same as the polymer material constructing the second lamination layer 210b, and a ratio of a height of the first lamination layer 210a and a height of the second lamination layer 210b is from 1:1 to 1:2.

Figure 5:
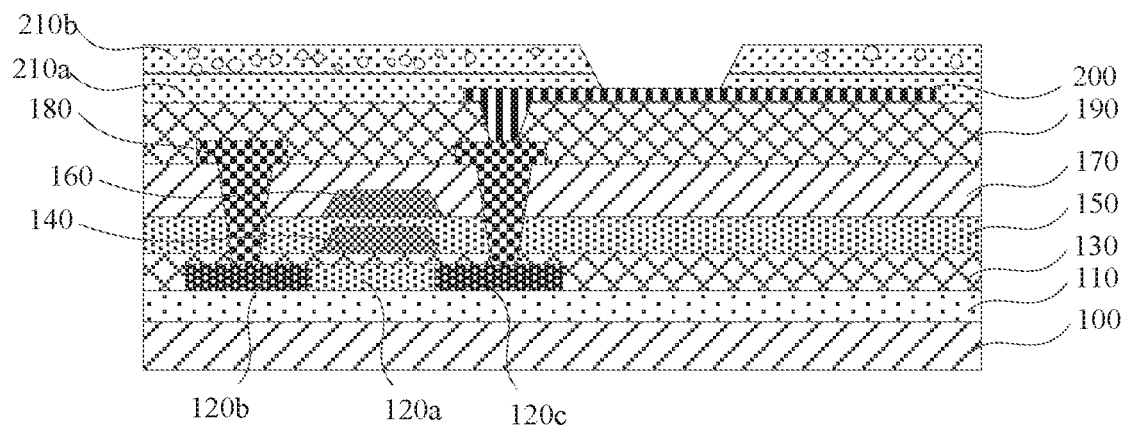
Figure 6:
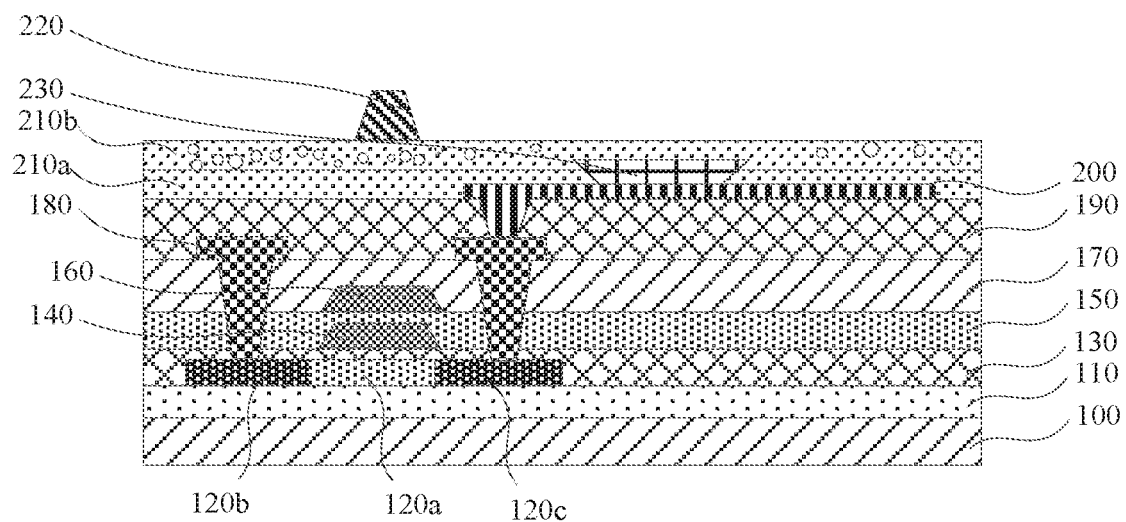

Then, with reference to FIG. 5, exposure, development, and curing are implemented to form a patternized pixel definition layer, i.e., the first lamination layer 210a and the second lamination layer 210b, and the anode metal layer 200 is partially exposed. Then, with reference to FIG. 6, coating, exposure, development, and curing are implemented on the second lamination layer 210b to form patternized photo spacers 220. Finally, with reference to FIG. 7, a light emitting structure and an encapsulation structure 250 are formed on the pixel definition layer.

Figure 8:
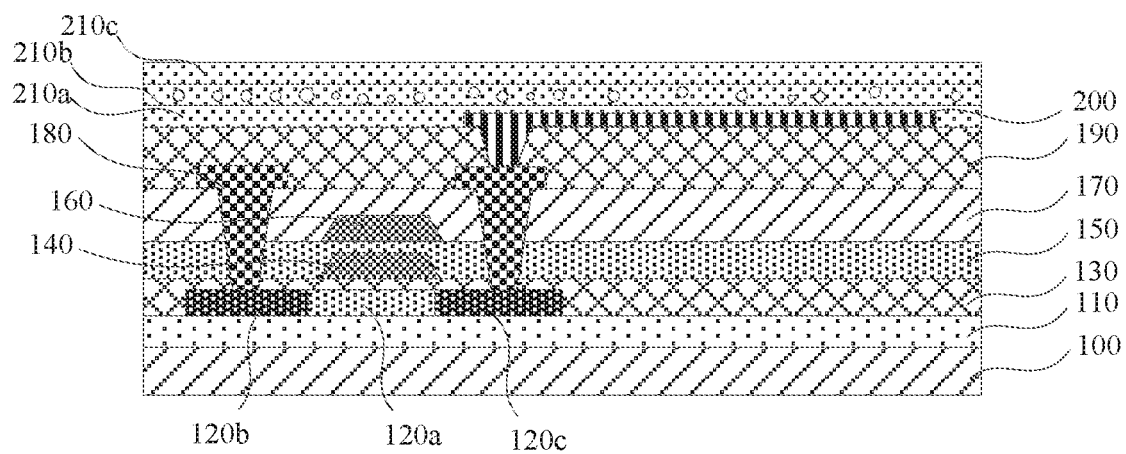
FIGS. 8 to 9 are schematic structural views of an anode of a display unit of another detailed embodiment of the present invention.

Preferably, in another embodiment of the present invention, in order to better suppress separation of film layers due to water absorption of the desiccants, as shown in FIG. 8, after the second lamination layer 210b is formed, steps are implemented as follows: a fourth lamination layer 210c is formed above the second lamination layer 210b, and the fourth lamination layer 210c comprises a structure and material that are the same as those of the first lamination layer 210a. The fourth lamination layer 210c can form a dense mesh structure being the same as the third lamination layer between the lamination layer 210b and fourth lamination layer 210c to further suppress film separation phenomenon possibly generated between the pixel definition layer and its upper layer including metal electrodes and the light emitting structure.

Accordingly, the present invention also provides an organic light emitting diode display device. The organic light emitting diode display device comprises a display unit, the display unit comprises: a substrate; a thin film transistor layer disposed above the substrate; an anode metal layer disposed above the thin film transistor layer, and connected to a source and drain wiring layer of the thin film transistor layer; a pixel definition layer disposed above the anode metal layer, wherein the pixel definition layer comprises a communication hole defined through the pixel definition layer; and a light emitting structure disposed above the pixel definition layer; wherein the pixel definition layer comprises a first lamination layer disposed above the anode metal layer and a second lamination layer disposed above the first lamination layer, and desiccants are distributed evenly in the second lamination layer.

The present invention provides a display unit of an organic light emitting diode display device and a display unit manufacturing method that, by manufacturing a pixel definition layer into a lamination layer structure with two or more layers and adding desiccants into an uppermost layer of the lamination layer structure, prevents water in the substrate from invading the organic light emitting unit. In another aspect, a high molecular polymer with a functional group on the main catenation is used as material constructing the lamination layer structure with the two or more layers (the functional group can be alkenyl, carboxyl or amino). As the functional group on the main catenation of the high molecular polymer further reacts, the two or more layers of the lamination layer structure have tightly connected boundaries therebetween to suppress separation of film layers due to water absorption of the desiccants.

Although the preferred embodiments of the present invention have been disclosed as above, the aforementioned preferred embodiments are not used to limit the present invention. The person of ordinary skill in the art may make various changes and modifications without departing from the spirit and scope of the present invention. Therefore, the scope of protection of the present invention is defined by the scope of the claims.

What is claimed is:

1. A display unit, wherein the display unit comprising:
   a substrate;
   a thin film transistor layer disposed above the substrate;
   an anode metal layer disposed above the thin film transistor layer, and connected to a source and drain wiring layer of the thin film transistor layer;
   a pixel definition layer disposed above the anode metal layer, wherein the pixel definition layer comprises a communication hole defined through the pixel definition layer; and
   a light emitting structure disposed above the pixel definition layer,
   wherein the pixel definition layer comprises a first lamination layer disposed above the anode metal layer and a second lamination layer disposed above the first lamination layer, and desiccants are distributed evenly in the second lamination layer, and
   wherein the first lamination layer and the second lamination layer are separate layers made of different materials.

2. The display unit as claimed in claim 1, wherein the first lamination layer consists of a polymer material including a first functional group, and the first functional group comprises one or more of an alkenyl group, a carboxyl group, and an amine group.

3. The display unit as claimed in claim 2, wherein the second lamination layer consists of a polymer material including a second functional group, and the second functional group comprises one or more of an alkenyl group, a carboxyl group, and an amine group; wherein when a temperature is increased, the second functional group and the first functional group on an abutment place between the first lamination layer and the second lamination layer are reacted chemically to form a third lamination layer, and the third lamination layer is a dense mesh structure.

4. The display unit as claimed in claim 3, wherein the polymer material of the first lamination layer and the polymer material of the second lamination layer are the same, and a ratio of a height of the first lamination layer and a height of the second lamination layer is from 1:1 to 1:2.

5. The display unit as claimed in claim 1, wherein the pixel definition layer further comprises a fourth lamination layer disposed above the second lamination layer, and the fourth lamination layer comprises a structure and material that are the same as those of the first lamination layer.

6. The display unit as claimed in claim 1, wherein the desiccants are physical desiccants and/or chemical desiccants, and comprise a combination of one or more of tantalum, calcium oxide, calcium carbonate; wherein the desiccants are particle solids with same shapes and the particle solids are distributed evenly in the second lamination layer.

7. A display unit manufacturing method, comprising steps as follows:
providing a substrate;
forming a thin film transistor layer above the substrate;
forming an anode metal layer located above the thin film transistor layer and connected to a source and drain wiring layer in the thin film transistor layer;
forming a pixel definition layer located above the anode metal layer, and defining a communication hole extending through the pixel definition layer; and
forming a light emitting structure located above the pixel definition layer,
wherein the pixel definition layer comprises a first lamination layer located above the anode metal layer and a second lamination layer located above the first lamination layer, and the second lamination layer comprises desiccants distributed evenly in the second lamination layer, and
wherein the first lamination layer and the second lamination layer are separate layers made of different materials.

8. The display unit manufacturing method as claimed in claim 7, wherein the first lamination layer consists of a polymer material including a first functional group, and the first functional group comprises one or more of an alkenyl group, a carboxyl group, and an amine group; the second lamination layer consists of a polymer material including a second functional group, and the second functional group comprises one or more of an alkenyl group, a carboxyl group, and an amine group; wherein when a temperature is increased, the second functional group and the first functional group on an abutment place between the first lamination layer and the second lamination layer are reacted chemically to form a third lamination layer, and the third lamination layer is a dense mesh structure.

9. The display unit manufacturing method as claimed in claim 8, wherein the polymer material of the first lamination layer and the polymer material of the second lamination layer are the same, and a ratio of a height of the first lamination layer and a height of the second lamination layer is from 1:1 to 1:2.

10. The display unit manufacturing method as claimed in claim 7, wherein the pixel definition layer further comprises a fourth lamination layer disposed above the second lamination layer, and the fourth lamination layer comprises a structure and material that are the same as those of the first lamination layer.

11. An organic light emitting diode display device, wherein the organic light emitting diode display device comprises a display unit, and the display unit comprises:
a substrate;
a thin film transistor layer disposed above the substrate;
an anode metal layer disposed above the thin film transistor layer, and connected to a source and drain wiring layer of the thin film transistor layer;
a pixel definition layer disposed above the anode metal layer, wherein the pixel definition layer comprises a communication hole defined through the pixel definition layer; and
a light emitting structure disposed above the pixel definition layer,
wherein the pixel definition layer comprises a first lamination layer disposed above the anode metal layer and a second lamination layer disposed above the first lamination layer, and desiccants are distributed evenly in the second lamination layer, and
wherein the first lamination layer and the second lamination layer are separate layers made of different materials.

12. The organic light emitting diode display device as claimed in claim 11, wherein the first lamination layer consists of a polymer material including a first functional group, and the first functional group comprises one or more of an alkenyl group, a carboxyl group, and an amine group.

13. The organic light emitting diode display device as claimed in claim 12, wherein the second lamination layer consists of a polymer material including a second functional group, and the second functional group comprises one or more of an alkenyl group, a carboxyl group, and an amine group; wherein when a temperature is increased, the second functional group and the first functional group on an abutment place between the first lamination layer and the second lamination layer are reacted chemically to form a third lamination layer, and the third lamination layer is a dense mesh structure.

14. The organic light emitting diode display device as claimed in claim 13, wherein the polymer material of the first lamination layer and the polymer material of the second lamination layer are the same, and a ratio of a height of the first lamination layer and a height of the second lamination layer is from 1:1 to 1:2.

15. The organic light emitting diode display device as claimed in claim 11, wherein the pixel definition layer further comprises a fourth lamination layer disposed above the second lamination layer, and the fourth lamination layer comprises a structure and material that are the same as those of the first lamination layer.

16. The organic light emitting diode display device as claimed in claim 11, wherein the desiccants are physical desiccants and/or chemical desiccants, and comprise a combination of one or more of tantalum, calcium oxide, calcium carbonate; wherein the desiccants are particle solids with same shapes and the particle solids are distributed evenly in the second lamination layer.

* * * * *